United States Patent

Rogers et al.

[15] 3,683,289

[45] Aug. 8, 1972

[54] TRANSISTOR AMPLIFIERS

[72] Inventors: Ernest W. Rogers, Horley; Lewis P. Learney, Crawley Down, both of England

[73] Assignee: Redifon Limited, London, England

[22] Filed: May 19, 1970

[21] Appl. No.: 38,726

[30] Foreign Application Priority Data

July 14, 1969 Great Britain..........35,346/69

[52] U.S. Cl.......................................330/15, 330/19

[51] Int. Cl...............................................H03f 3/26

[58] Field of Search...................330/15, 19, 118, 122

[56] References Cited

UNITED STATES PATENTS 3,488,603 1/1970 Rogers.........................330/15

OTHER PUBLICATIONS

Radio Amateur' s Handbook, p. 212, 17th Ed., 1939

*Primary Examiner*—Roy Lake
*Assistant Examiner*—Lawrence J. Dahl
*Attorney*—Larson, Taylor and Hinds

[57] ABSTRACT

A transistor push-pull amplifier having a Class A transistor pair driving a Class B transistor pair by way of an interstage inductive coupling comprising a pair of mutually coupled tapped windings, the said windings being connected in the Class A circuits and those portions between the taps and corresponding ends of the winding being also connected in the Class B circuits.

4 Claims, 1 Drawing Figure

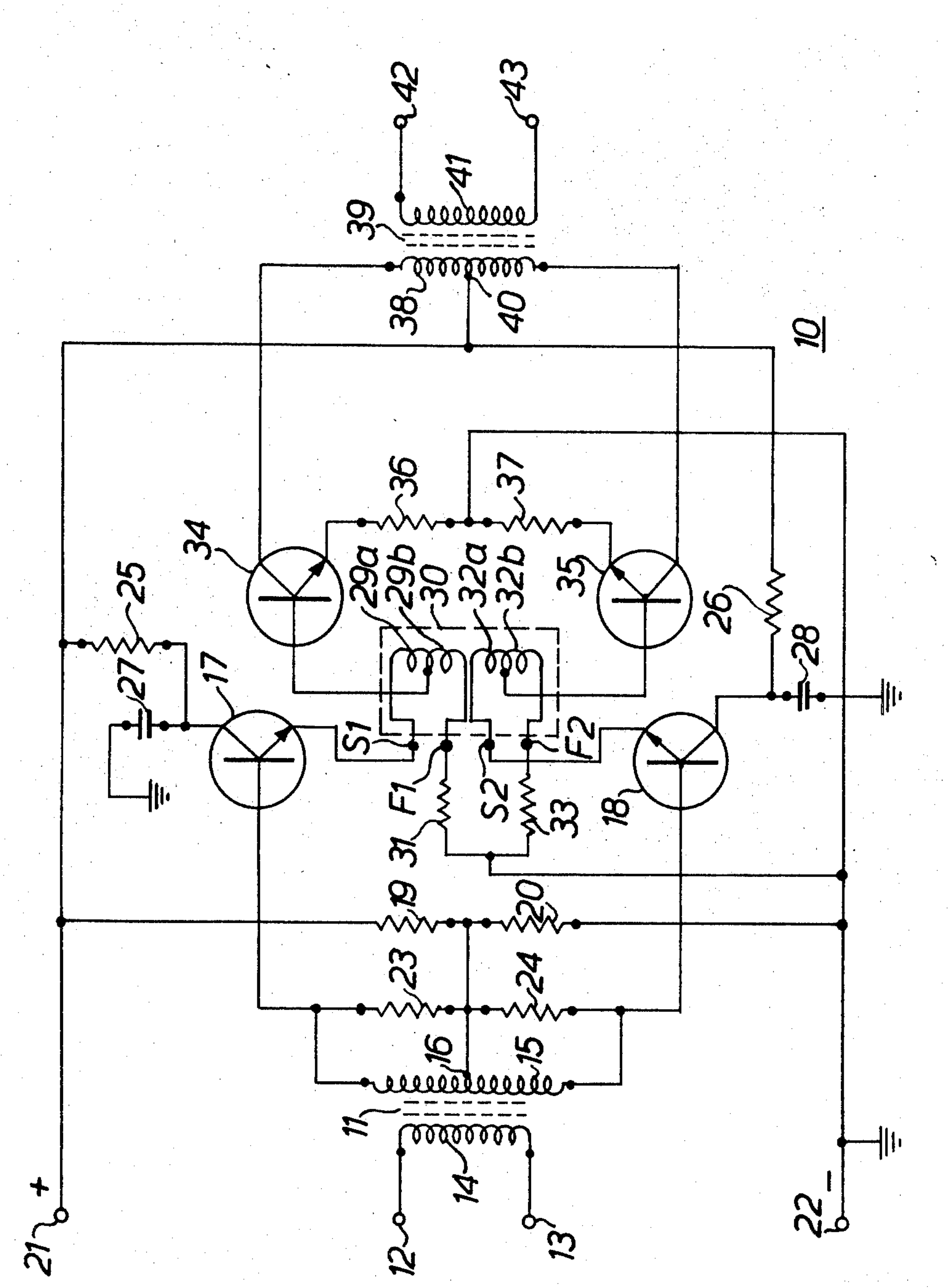
21
+
12
13
14
11
16
15
23
24
19
20
31
F1
S2
33
18
S1
F2
17
27
25
34
29a
29b
30
32a
32b
35
36
37
26
28
38
40
39
41
42
43
10
22
–

TRANSISTOR AMPLIFIERS

This invention relates to transistor amplifiers and in particular to multi-stage transistor amplifiers of the push-pull type, capable of operating over a wide band of frequencies, in which the stages are coupled directly and by an inductive device in order to provide improved performance of the amplifier.

It is known to use a push-pull amplifier in which a pair of transistors, biased so as to operate under class A conditions, are coupled by way of a transformer to drive a further pair of transistors, biased so as to operate under class B conditions. It is also known to use a push-pull amplifier in which a pair of transistors, biased so as to operate under class B conditions, are directly coupled to drive a further pair of transistors, biased so as to operate under class B conditions.

In the transformer coupled arrangement, difficulty is experienced in providing a driver transformer for the class B stage, having a sufficiently low leakage reactance to achieve efficient transfer of power over a wide range of frequencies with low distortion.

It is further known, therefore, to use an interstage inductive coupling device comprising a pair of radio frequency coils tightly coupled together and connected in such sense that power for driving the class B operated transistors is provided by the class A operated transistors of the previous stage, in part by direct coupling and in part by way of the tightly coupled coils.

A disadvantage has been experienced with the last-described arrangement by reason of the output impedance of the class A driver stage not being sufficiently low to permit of driving the class B operated transistors with low distortion.

The object of the present invention is to provide a transistor amplifier having an improved performance in respect of the said disadvantage.

Accordingly the present invention provides a multi-stage transistor amplifier for electric wave signals having first and second branches for providing push-pull operation of the amplifier, comprising in cascade a first stage for operation under class A conditions, an inductive device having a pair of tapped windings and a second stage for operation under class B conditions and, an output electrode of a transistor in the first branch of the first stage being connected to one end of one of said tapped windings, an output electrode of a transistor of the second branch of the first stage being connected to one end of the other one of said tapped windings, an input of a transistor in the first branch of the second stage being connected to the tapping of said one tapped winding and an input electrode of a transistor in the second branch of the second stage being connected to the tapping of said other one of said tapped windings, the two said windings of said inductive device being connected in such sense that power for driving each said transistor of the second stage is provided by both said transistors of the first stage.

In order that the invention may be readily carried into practice, an embodiment thereof will now be described in detail, by way of example, with reference to the accompanying drawing, the sole figure of which is a schematic circuit diagram of a multi-stage, transistor, push-pull amplifier.

Briefly, the circuit of the amplifier to be described in detail in this specification has two stages, each of which comprises a pair of transistors connected in a push-pull circuit arrangement. Each transistor of the pair of transistors forming the first stage is connected in an emitter-follower configuration and each transistor of the pair of transistors forming the second stage is connected in a common emitter configuration. The transistors of the first stage are biased so as to operate under class A conditions and the transistors of the second stage are biased so as to operate under class B conditions. The transistors of the amplifier are of similar conductivity type, that is to say, all of n-p-n or all of p-n-p of the invention to be described in detail later in this specification, n-p-n transistors are used.

The emitter electrode of one of the transistors of the first stage is conductively coupled to the base electrode of one of the transistors of the second stage, by way of a part of one winding of two tightly coupled windings of an inductive device. The emitter electrode of the other transistor of the first stage is conductively coupled to the base electrode of the other transistor of the second stage, by way of a part of the other winding of the inductive device. The two windings are connected to two resistors which provide a conductive path for the emitter currents of the transistors of the first stage and bias voltages for the base electrodes of the transistors of the second stage.

Therefore, by arranging that the windings of the inductive device are connected in the circuit in an appropriate sense, power for driving a transistor of the second stage, in the period of time during which it is operative, is provided not only by the transistor of the first stage to which it is directly coupled but in part by the other transistor of the first stage, therefore more power is available for driving the transistors of the second class B stage, so that the efficiency of the amplifier is improved. Because of the sharing of the load by the transistors of the first stage, regulation is improved and distortion, due to the effect of the intermittent load imposed by each transistor of the second stage, is reduced.

Furthermore, by using an inductive device comprising two tightly-coupled multi-turn windings, by connecting one end of each said winding to the emitter electrode of one of the class A operated driver transistors, by connecting the other end of the winding to a bias resistor and by connecting the base electrode of the corresponding class B operated transistor to a tapping of the winding, the output impedance of the driver stages is reduced.

Referring now to the FIGURE, an amplifier of the kind referred to, which is indicated generally in the drawing by the reference number 10, is fed with an input signal, having a frequency in the band from 2 to 12 megacycles per second, by way of a transformer 11, from a source of radio frequency signals, not shown in the drawing, connected to terminals 12 and 13.

The transformer 11 has a primary winding 14, which is connected to the terminals 12 and 13 of the signal source, and a secondary winding 15, by which a push-pull signal output is provided with respect to a center-tap 16 of the secondary winding.

The ends of the secondary winding 15 are connected to the base electrodes of first and second transistors, 17 and 18, respectively, of a pair of transistors forming the first push-pull stage of the amplifier. The transistors 17 and 18 are of n-p-n type and are connected in an emitter-follower configuration.

A bias voltage of positive polarity, with respect to chassis, is provided for the transistors 17 and 18 by connecting the center-tap 16 to the junction point of a potentiometer network comprising two series connected resistors 19 and 20. The resistors 19 and 20 are connected to supply terminals 21 and 22 respectively, which form the positive and negative poles respectively of a source of supply of direct current, not shown in the drawing. The source of supply is designed so as to offer negligible impedance to alternating currents of the signal frequency of the amplifier. Terminal 22 of the source of supply is connected to chassis. The resistors 19 and 20 are of a value such that the transistors 17 and 18 are operated under class A conditions.

A resistor 23 is connected across one-half of the secondary winding 15 of the transformer and a resistor 24 is connected across the other half of the secondary winding, in order to provide a substantially constant load on the transformer irrespective of changes in the input impedance of the transistors 17 and 18.

The collector electrodes of the transistors 17 and 18 are connected to the terminal 21 of the source of supply of direct current by way of decoupling resistors 25 and 26 respectively. Alternating currents of signal frequency are bypassed to chassis by capacitors 27 and 28, connected respectively to the collector electrodes of the transistors 17 and 18.

The emitter electrode of the transistor 17 is connected to chassis by way of a first winding *29a*, *29b* of an inductive device 30 and by way of a resistor 31. The emitter electrode of the transistor 18 is connected to chassis by way of a second winding *32a*, *32b* of the inductive device 30 and by way of a resistor 33.

A pair of transistors 34 and 35 form a second push-pull stage of the amplifier. The transistors 34 and 35 are both of n-p-n type and connected in a common emitter configuration.

The inductive device 30, by which energy is transferred from one branch to the other branch of the amplifier comprises the two tapped windings, wound in the same direction on a core of small physical dimensions, with the turns in intimate contact, to provide the tightest possible magnetic coupling between the two windings. The tapped windings are shown as *29a*, *29b* and *32a*, *32b* respectively, the tap of the winding defining the two parts suffuxed "*a*" and "*b*". The base electrode of transistor 34 is connected to the tapping of winding *29a*, *29b* and is thereby conductively connected to the emitter electrode of transistor 17 and to the resistor 31. The base electrode of transistor 35 is connected to the tapping of winding *32a*, *32b* and is thereby conductively connected to the emitter electrode of transistor 18 and to the resistor 33.

The desired reversal of phase for the transfer of energy from one branch of the amplifier to the other branch, thereof, is provided by connecting the start of winding part *29a* and finish of winding part *29b*, indicated in the drawing by S1 and F1, respectively, to the emitter electrode of the transistor 17 and to the resistor 31 respectively, and by connecting the start of winding part *32a* and finish of winding part *32b*, indicated in the figure by references S2 and F2 respectively, to the emitter electrode of the transistor 18 and to the resistor 33 respectively.

As already described, the resistors 31 and 33 provide a conductive path for the emitter currents of the transistors 17 and 18 and bias voltages of a value such that the transistors 34 and 35 operate under class B conditions.

The emitter electrodes of the transistors 34 and 35 are connected to chassis by way of resistors 36 and 37 respectively, and the collector electrodes of the transistors 34 and 35 are connected to the ends of a primary winding 38 of a push-pull output transformer 39.

The primary winding 38 is provided with a center tap 40, which is connected to the terminal 21, so that current is supplied to the collector electrodes of the transistors 34 and 35 by way of the primary winding of the transformer.

As the transistors 34 and 35 are connected in a common emitter configuration, a small amount of current feedback is provided by the resistors 36 and 37, thereby raising the input impedance of the second stage of the amplifier and protecting the transistors 34 and 35 from damage due to thermal runaway.

The output transformer 39 has a secondary winding 41 connected to output terminals 42 and 43, from which power is supplied to a load connected thereto. The number of turns of the secondary winding 41 and the turns ratio may be chosen to match a wide range of external impedances forming either a balanced or unbalanced load.

In an alternative arrangement, the emitter resistors 31 and 33, providing bias for the transistors 34, 35 of the second stage may be replaced by a single resistor. Also, the emitter resistors 36 and 37 of the output stage transistors may be replaced by a single resistor.

However, the described arrangement using separate emitter resistors is preferred, since it is then unnecessary to select for that stage a pair of transistors having similar electrical characteristics.

By way of example only, type numbers and values are given for the circuit elements of the amplifier shown in the figure:

| | |
|---|---|
| Transformer 11 | Impedance ratio 50:100+100 ohms. Windings 14 and 15 respectively. |
| Transistors 17 and 18 | RCA(Registered Trade Mark) 2N2631 type (n-p-n) |
| Resistor 19 | 470 ohms |
| Resistor 20 | 56 ohms |
| Resistors 23 and 24 | 120 ohms |
| Resistors 25 and 26 | 30 ohms |
| Capacitors 27 and 28 | 0.1 microfarad |
| Transistors 34 and 35 | RCA(Registered Trade Mark) 40341 type (n-p-n) |
| Inductive Device 30 | Described in detail subsequently |
| Resistors 31 and 33 | 3.3 ohms |
| Resistors 36 and 37 | 0.5 ohm |
| Transformer 39 | Impedance Ratio 6+6:75 ohms Windings 38 and 41 respectively. |
| D.C. Source of Supply | +24 volts(Terminal 21). |

In the example described, the inductive device 30 is of shell type construction, provided by a core of manganese-zinc ferrite, having dimensions of ¼ × 9/32 × 11/64 inch. The two windings *29a*, *29b* and *32a*, *32b* are each of two turns of 32 SWG triple stranded enamel covered wire in total. The winding parts *29a* and *32a* are each of one turn and the parts *29b* and *32b* are each of turn. The turns of the two windings are wound in intimate contact, to provide close coupling, and in the same direction around the center limb of the core. Each of the windings has an inductance of approximately 26 microhenries.

A direct current of approximately 150 milliamps is passed from the emitter electrodes of the transistors 17 and 18 through each winding. Using an inductive device of this form, in the circuit arrangement already described and shown in the figure, it is possible to obtain efficient transfer of power from the first to the second stage of the amplifier over a range of frequencies from 200 kilocycles per second to 40 megacycles per second so as to provide a radio frequency power output into the load of 25 watts.

In an amplifier, suitable for amplification of audio frequencies over the frequency range of 30 cycles per second to 30,000 cycles per second, the inductive device 30 is provided by an E-type of core of laminated nickel iron alloy, having approximate dimensions of 1½ × 1½ × 1½ inch and having two windings, each of 300 turns, the two windings being bifilar wound to provide tight coupling between them. The total inductance of each winding is approximately 100 millihenries. The two windings of 300 turns are both tapped to provide first winding parts 29*a* and 32*a* of 100 turns and second winding parts 29*b* and 32*b* of 200 turns.

In the amplifier of the invention, as described, the output impedance of the driver stages is reduced in the ratio of the square of the number of turns to the tapping of the winding to the total number of turns of the winding, that is:

$$\left(\frac{29b}{29a+29b}\right)^2$$

and $$\left(\frac{32b}{32a+32b}\right)^2$$

In the case of the radio frequency amplifier described, this is a ratio of 1:4

In the case of the audio frequency amplifier described, this is a ratio of 4:9

We claim:

1. A multi-stage transistor amplifier for electric wave signals having first and second branches for providing push-pull operation of the amplifier, comprising in cascade a first stage for operation under class A conditions, an inductive device having a pair of tapped windings, and a second stage for operation under class B conditions, an output electrode of a transistor in the first branch of the first stage being connected to one end of one of said tapped windings, an output electrode of a transistor of the second branch of the first stage being connected to one end of the other one of said tapped windings, an input electrode of a transistor in the first branch of the second stage being connected to the tapping of said one tapped winding and an input electrode of a transistor in the second branch of the second stage being connected to the tapping of said other one of said tapped windings, the two said windings of said inductive device being coupled in a sense such that power for driving a transistor of the second stage is provided by the transistor of the first stage to which it is directly connected and in part by the other transistor of the first stage, by way of the said inductive device, said amplifier including means for connecting the other end of said one tapped winding through a first resistor to a common point and means for connecting said other one of said tapped windings through a second resistor to said common point, said first and second resistors providing conductive paths for the output electrode currents of the first stage transistors and bias for the control electrodes of the second stage transistors.

2. A multi-stage amplifier as claimed in claim 1, in which the inductive device comprises a pair of coils having a high mutual inductance.

3. A multi-stage amplifier as claimed in claim 2, in which the inductive device comprises two coils with corresponding turns wound in the same sense and located side by side. transistors 4. A multi-stage amplifier as claimed in claim 1, in which the transistors of the first and second stages are of the same conductivity type, that is, all are of n-p-n type or all are of p-n-p type, the emitter of each first stage transistor is connected to one end of one tapped winding, the other end of each tapped winding is connected by way of a resistor to a common point and the base electrodes of each second stage transistors are connected to the tapping of that winding to which the first stage transistor of the same branch is connected, the two said resistors connected to the common point providing conductive paths for the emitter currents of the corresponding first stage transistors and base electrode bias for the corresponding second stage transistors.

* * * * *